United States Patent

[11] 3,566,213

[72] Inventor Reinhold Kaiser
Heilbronn, Germany
[21] Appl. No. 690,154
[22] Filed Dec. 13, 1967
[45] Patented Feb. 23, 1971
[73] Assignee Telefunken Patentverwertungsgesellschaft m.b.H.
Ulm/Danube, Germany
[32] Priority Dec. 24, 1966
[33] Germany
[31] T32853

[54] VOLTAGE LEVEL SENSITIVE SEMICONDUCTOR ARRANGEMENT
2 Claims, 7 Drawing Figs.

[52] U.S. Cl. .......... 317/235, 317/234, 330/70, 307/302
[51] Int. Cl. .......... H01l 9/00, H01l 9/12, H01l 11/00
[50] Field of Search .......... 330/70, 70 (S); 317/234/9, 234/7, 235/30; 307/302

[56] References Cited
UNITED STATES PATENTS
3,360,698 12/1967 Warner et al. .......... 317/235
3,118,114 1/1964 Barditch .......... 330/38
FOREIGN PATENTS
669,098 8/1963 Canada .......... 317/235

*Primary Examiner*—John W. Huckert
*Assistant Examiner*—Martin H. Edlow
*Attorney*—Spencer and Kaye

ABSTRACT: A semiconductor arrangement includes a semiconductor body largely formed of a material of a first conductivity type. Within this material of the first conductivity type a first zone is formed of material of the opposite conductivity type so as to form a PN junction, and appropriate means are provided to apply a voltage across this PN junction so as to create a space charge region which extends for a distance therefrom. Also within the material of the first conductivity type is formed a second zone of material of the opposite conductivity type. The second zone is spaced at such a distance from the PN junction that it will be contacted by the space charge region under appropriate conditions. Appropriate means are provided to give an indication of such a contact of the second zone.

Inventor:
Reinhold Kaiser
BY Spencer & Kaye
Attorneys

Inventor:
Reinhold Kaiser
BY Spencer & Kaye
Attorneys

Inventor:
Reinhold Kaiser
BY Spencer & Kaye
Attorneys

VOLTAGE LEVEL SENSITIVE SEMICONDUCTOR ARRANGEMENT

This invention relates to a semiconductor arrangement with at least one opposite conductivity type semiconductor zone in a semiconductor body of a first conductivity type. In such a semiconductor arrangement this invention is characterized in that a PN junction is arranged in the semiconductor body and spaced from the semiconductor zone in order to transmit a potential to the semiconductor zone in such a way that the space charge region generated when a voltage is applied to the PN junction extends to the semiconductor zone and effects a potential transmission to it by contacting the semiconductor zone.

The potential transmission suggested in accordance with this invention renders possible the production of a series of new devices and circuit arrangements on a semiconductor base, as for instance voltage indicators, limiting valve switches, filters, voltage stabilizers, teleprinters and semiconductor amplifiers. This is particularly valid when, according to a further development of this invention, several such semiconductor zones are arranged in the vicinity of the PN junction or of several PN junctions, with the spacings of the semiconductor zones from the PN junctions being different and selected in such a way that a potential transmission is effected to the individual semiconductor zones with different voltages at the PN junction or PN junctions.

With a semiconductor arrangement which in accordance with this invention has a PN junction and a semiconductor zone in the semiconductor body, the PN junction is developed for instance by a region situated between this PN junction and the semiconductor zone, the conduction type of which region is opposite to that of the semiconductor zone, as well as by an adjacent region, the conduction type of which coincides with that of the semiconductor zone. The same is valid for several PN junctions in the semiconductor body. The semiconductor zones neighboring the PN junction also form PN junctions with the adjacent regions of the semiconductor body.

Besides a large number of other application possibilities this invention renders possible, for instance, the production of a new voltage indicator on a semiconductor base. According to one mode of operation of this invention, such a voltage indicator consists, for instance, of a semiconductor body with a semiconductor zone and a PN junction arranged in the vicinity of the semiconductor zone. The space between the semiconductor zone and the PN junction as well as the doping in the region of the space charge zone are therein selected in such a way that a potential transmission to the semiconductor zone through the space charge zone of the PN junction is a measure of the blocking voltage applied to the PN junction. According to another mode of operation of this invention, a voltage indicator consists of a semiconductor body with a PN junction, wherein however several semiconductor zones are arranged in the vicinity of the PN junction contrary to the voltage indicator described before. The spacings of these semiconductor zones from the PN junction are selected differently and in such a way that a potential transmission to the individual semiconductor zones is again a measure of different blocking voltages applied to the PN junction. Several PN junctions can also be available instead of just one PN junction.

According to a specific embodiment of the invention, a filtering arrangement is realized by providing a semiconductor body of one conductivity type having formed therein a PN junction and an opposite conductivity type zone spaced from the PN junction. A signal containing two alternating components is applied across the PN junction. One of the components of the applied across the PN junction. One of the components of the applied signal is of sufficient magnitude to produce a space charge region which will extend from the PN junction to the opposite conductivity type zone, while the other component of the applied signal is of a magnitude insufficient to produce a space charge region which will extend to the opposite conductivity type zone. Connected to the opposite conductivity type zone is a means for providing an output signal of a first valve when the zone is contacted by the space charge region and of a different value when the opposite conductivity type zone is not contacted by the space charge region.

BRIEF DESCRIPTION OF THE DRAWINGS

FIG. 1 shows the basic construction of a voltage indicator according to this invention. According to FIG. 1 the voltage indicator consists of a semiconductor body 1 of a first conductivity type, e.g. P type, into which is formed a semiconductor zone 2 of the opposite conductivity type, e.g. N type, according to the planar technique through a window in the insulating layer 7 situated on the surface of the semiconductor body. In order to apply a potential to this semiconductor zone 2, a PN junction 3 is formed in the vicinity of this semiconductor zone, which PN junction 3 results by diffusing a semiconductor region 4 of N conduction type into the semiconductor body 1 of P conduction type. The PN junction 3 must be sufficiently close to the semiconductor zone 2 so that the semiconductor zone 2 is contacted by the space charge region or zone 5 created when a defined blocking voltage is applied to the semiconductor body 1 and the semiconductor region 4 i.e., across the PN junction 3. FIG. 2 shows this contacting state, in which the space charge region 5 of the PN junction 3 extends to the semiconductor zone 2. The contacting of the semiconductor zone 2 by the space charge region 5 is followed by the transmission of a potential to the semiconductor zone 2, which potential is dependent on the voltage applied to the PN junction 3. The voltage which is required to permit the space charge region 5 to reach the semiconductor zone 2, besides being dependent on the space between the PN junction 3 and the semiconductor zone 2 is also dependent on the doping of the region 6, which is that portion of the body 1 situated between the PN junction 3 and the semiconductor zone 2.

FIG. 3 shows a voltage indicator in a plan view, in which according to this invention, several semiconductor zones (2*a*, 2*b*, 2*c*) are arranged at various spacings from a PN junction 3, which results from the zone 4 penetrating into the semiconductor body. Different voltages at the PN junction can be measured with such an arrangement.

FIG. 4 shows a limiting value switch, which switches at a defined limiting value of voltage and which is also based on the novel principle of the invention. This limiting value switch consists of a semiconductor body 1 of one conductivity type, N type, in this figure, having formed in one surface side thereof two zones 2 and 4 of opposite conductivity type, e.g. P type 4. If a blocking voltage is applied to the PN junction 3 and this voltage is increased sufficiently so that the space charge region of the PN junction 3 contacts the P zone 2, a potential is transmitted to the zone 2, which releases a switching mechanism by which it operates the switching member 8. The release of the switching mechanism is effected at a defined limiting value of the voltage at the PN junction 3.

junction 3. With less sensitive switching members, an amplifier 9 can be connected between the semiconductor zone 2 and the switching member 8.

Figure 1:
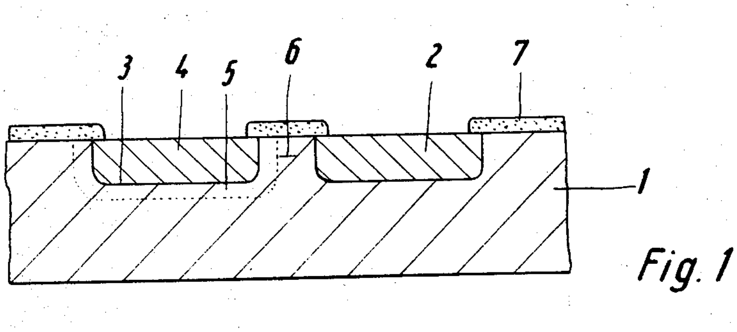
FIG. 1 is a sectional view through a semiconductor arrangement according to one embodiment of the invention.
Figure 2:
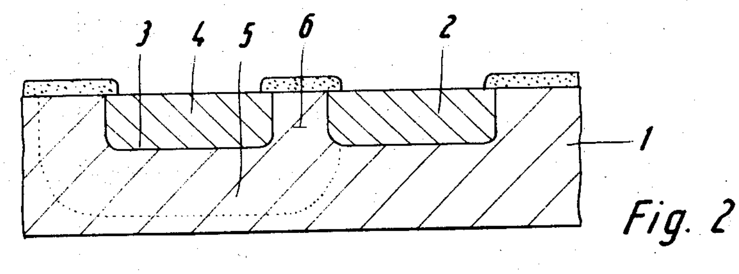
FIG. 2 is a sectional view, similar to FIG. 1, but showing the space charge zone formed by a PN junction in its extended position.
Figure 3:
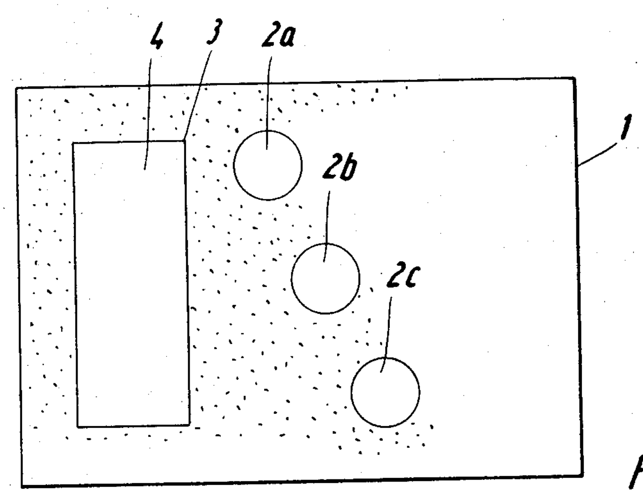
FIG. 3 is a plan view of a voltage indicator formed according to another embodiment of the invention.
Figure 4:
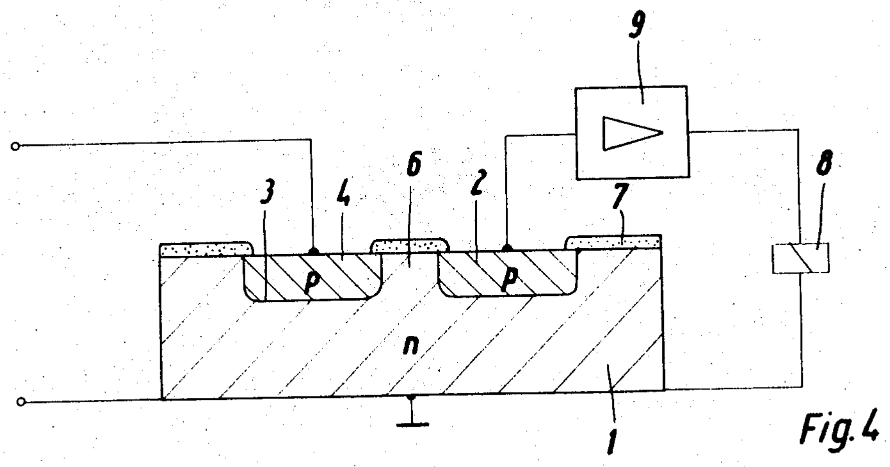
FIG. 4 is a sectional view, partially schematic, of a limiting value switch formed according to another embodiment of the invention.
Figure 5:
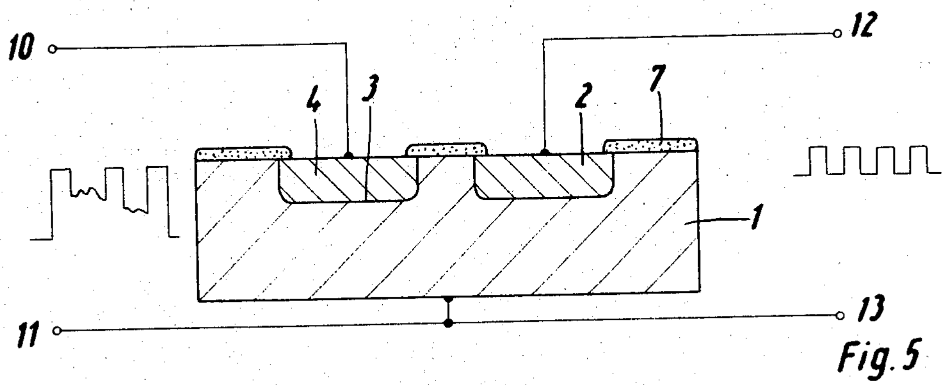
FIG. 5 is a sectional view of a filter formed according to still another embodiment of the invention.

The semiconductor arrangement of FIG. 4 can also be used, for instance, as a filter. If, according to FIG. 5, a signal which consists of an effective component and an interfering component is applied to the input of this arrangement, that is, to terminals 10 and 11, by a corresponding arrangement of the PN junction 3 in the vicinity of the semiconductor zone 2 and by a corresponding doping of the intermediate region for the case where the interfering component is smaller than the effective component, it can be arranged that only the effective component is available at the output, that is, between terminals 12 and 13. In this manner, that is by a corresponding distance between the semiconductor zone and the PN junction as well as by a corresponding doping of the intermediate region, a filter effect is obtained.

Figure 6:
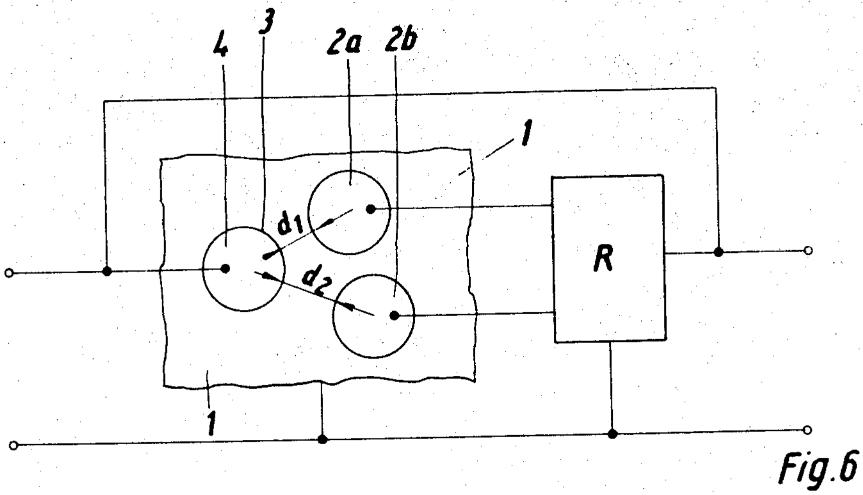
FIG. 6 is a plan view, partially schematic, of a voltage stabilizer according to still another embodiment of the invention.

FIG. 6 shows the basic arrangement of a voltage stabilizer according to this invention. In the practical example according to the plan view of FIG. 6, this voltage stabilizer according to this invention. In the practical example according to the plan view of FIG. 6, this voltage stabilizer consists of a semiconductor body 1 with a PN junction 3 and two semiconductor zones 2*a* and 2*b* in the vicinity of the PN junction at different spacings therefrom. The zones 2*a* and 2*b* form PN junctions with the semiconductor body as in the arrangements described previously. Because the semiconductor zones 2*a* and 2*b* are arranged at different spacings from the PN junction 3, by a control member R connected after this arrangement, the voltage can be held constant between two voltage values. The control member R has the characteristic of controlling the input voltage at the PN junction 3 by reducing it when the space charge region extend from the PN junction 3 to the remote or furthest semiconductor zone 2*b*, but increasing it when the space charge region of the PN junction 3 only reaches the less remote or nearer semiconductor zone 2*a*.

Figure 7:
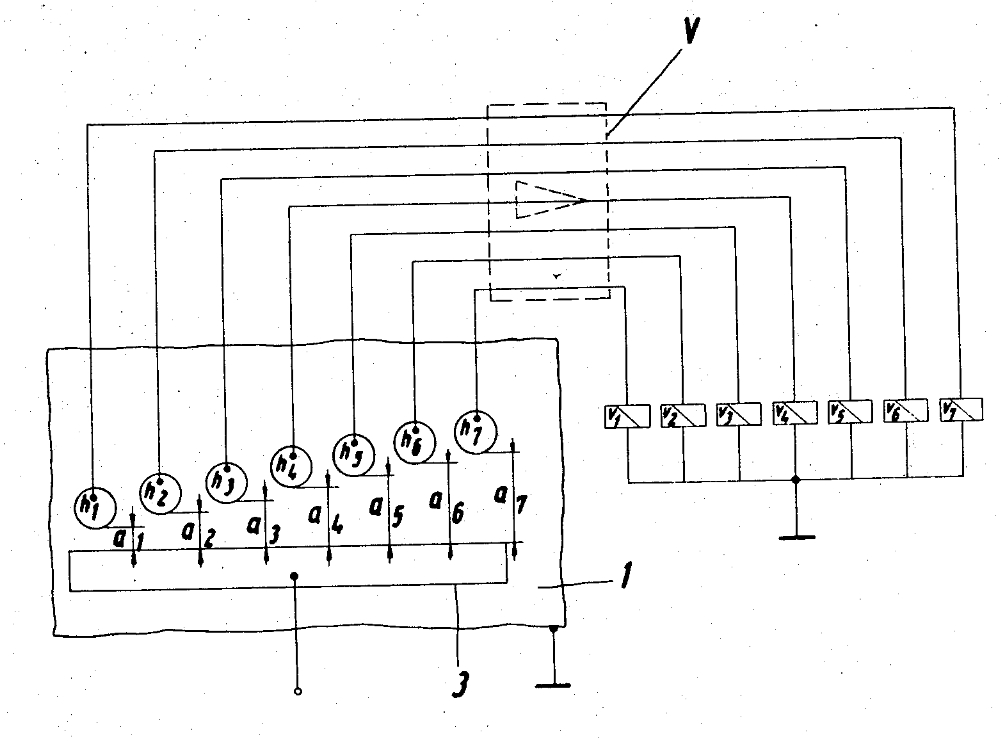
FIG. 7 is a plan view, partially schematic, of still another embodiment of the invention which may be used as a part of a teleprinter. This invention will new be explained in relation to practical examples.

FIG. 7 shows an arrangement of this invention which can be used for instance as a teleprinter. This arrangement consists of a semiconductor body 1 with a PN junction 3 as well as of different semiconductor zones ($h_1$.....$h_7$) which are arranged at different spacings ($a_1$......$a_7$) from the PN junction. One of the semiconductor zones obtains a potential according to the blocking voltage connected at the PN junction. If a blocking voltage is connected to the PN junction, which blocking voltage is so large that the space charge zone of the PN junction extends for instance to the semiconductor zone $h_5$, the semiconductor zones $h_1$ to $h_4$ closer to the PN junction obtain a potential in addition to the semiconductor zone $h_5$. Because only one of the relays $r_1$.....$r_7$ connected to the individual semiconductor zones is to respond to a defined voltage at the PN junction, a barrier must be provided to insure that in this example to the relays $r_1$ to $r_4$ assigned to the semiconductor zones $h_1$ to $h_4$ do not respond. Because the potential at the semiconductor zone $h_5$ is smaller than the potential at the closer semiconductor zones $h_1$ to $h_4$, in the above-mentioned case only, that relay must respond to which the smallest potential is connected. If a teleprinter is now available and a defined voltage is assigned to each teleprinter key, a communication can be transmitted according to the above-described principle, if it is insured that on the receiving side the transmitted signals reach the semiconductor arrangement there provided without errors. If necessary an amplifier V is situated between the semiconductor zones $h_1$ to $h_7$ and the relays $r_1$ to $r_7$, which amplifier is shown in dotted lines in FIG. 7.

I claim:

1. A semiconductor arrangement comprising, in combination:
   a. a semiconductor body of a first conductivity type,
   b. a first zone of semiconductor material of a conductivity type opposite to that of said first type formed within said body and extending to one surface thereof, said first zone and said body forming a first PN junction therebetween;
   c. a second zone of semiconductor material of said opposite conductivity type formed within said semiconductor body and extending to said surface, said first and second zones being spaced from each other at a distance such that said second zone can be contacted by a space charge region created at said PN junction;
   d. means for applying a signal across said PN junction containing two alternating voltage components, one of said components includes voltage variations sufficiently great to create a space charge region which extends from said PN junction and contacts said second zone, and the other of said components contains voltage variations which create a space charge region which does not extend to said second zone; and
   e. means connected to said second zone for transmitting a signal of one value when said second zone is contacted by said space charge region, and of a different value when said second zone is not contacted by said space charge region, whereby said combination serves as a filter for passing said first component and blocking said second component.

2. An electrical filter arrangement comprising, in combination:
   a. a semiconductor body of a first conductivity type;
   b. a region of opposite conductivity type material forming a first PN junction with said semiconductor body;
   c. a zone within said semiconductor body of a conductivity type opposite that of said first conductivity type, said zone being spaced from said first PN junction;
   d. means for applying a signal across said PN junction containing two components, the first component of which includes voltage variations which are of sufficient magnitude to create a space charge region which will extend from said PN junction to said zone, the second component of said signal containing voltage variations which are less are less than that needed to create such a space charge region; and
   e. means connected to said zone for producing a signal of a given intensity level when said zone is contacted by said space charge region, and for delivering a signal of a different intensity when said zone is not contacted by said space charge region.